US009548179B2

(12) United States Patent
Cho et al.

(10) Patent No.: US 9,548,179 B2
(45) Date of Patent: Jan. 17, 2017

(54) ION TRAP APPARATUS AND METHOD FOR MANUFACTURING SAME

(71) Applicants: SK TELECOM CO., LTD., Seoul (KR); SEOUL NATIONAL UNIVERSITY R&DB FOUNDATION, Seoul (KR)

(72) Inventors: Dongil Cho, Seoul (KR); Taehyun Kim, Seoul (KR); Jongkeon Yoon, Seongnam-si (KR); Byoungdoo Choi, Seoul (KR); Seokjun Hong, Seoul (KR); Minjae Lee, Seoul (KR)

(73) Assignees: SK TELECOM CO., LTD., Seoul (KR); SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 0 days.

(21) Appl. No.: 14/878,375

(22) Filed: Oct. 8, 2015

(65) Prior Publication Data

US 2016/0027604 A1 Jan. 28, 2016

Related U.S. Application Data

(63) Continuation of application No. PCT/KR2014/007364, filed on Aug. 8, 2014.

(30) Foreign Application Priority Data

Oct. 14, 2013 (KR) ........................ 10-2013-0121955

(51) Int. Cl.
*H01J 49/06* (2006.01)
*H01J 9/14* (2006.01)
(Continued)

(52) U.S. Cl.
CPC .. *H01J 3/00* (2013.01); *H01J 9/14* (2013.01); *H01J 49/0013* (2013.01); *H01J 49/422* (2013.01)

(58) Field of Classification Search
CPC .. H01J 49/0018; H01J 49/424; H01J 49/0013; H01J 49/009; H01J 49/06; H01J 49/422; H01J 49/4225; H01J 49/4295; H01J 3/00; H01J 9/14; G06N 99/002; B82Y 10/00; G04F 5/14; H01L 21/304; H01L 27/18; H01L 39/045; H01L 39/223; H01L 39/2493
(Continued)

(56) References Cited

U.S. PATENT DOCUMENTS 5,248,883 A * 9/1993 Brewer ..................... G04F 5/14 250/281
7,012,250 B1 * 3/2006 Aksyuk ................. H01J 49/424 250/281
(Continued)

FOREIGN PATENT DOCUMENTS

JP 2005158694 A 6/2005

OTHER PUBLICATIONS

Chiaverini et al., Surface-Electrode Architecture for Ion-Trap Quantum Information Processing, 2005, Quantum Information and Computation, vol. 5, No. 6, p. 419-439.*
(Continued)

*Primary Examiner* — David A Vanore
(74) *Attorney, Agent, or Firm* — Hauptman Ham, LLP

(57) ABSTRACT

An ion trap device includes a substrate over which at least one central DC electrode, an RF electrode and at least one side electrode are disposed. The central DC electrode includes a DC connector pad and a DC rail connected to the DC connector pad. The RF electrode includes at least one RF
(Continued)

rail located adjacent to the DC rail and an RF pad connected to the at least one RF rail. The RF electrode is disposed between the central DC electrode and the side electrode. At least one pair of electrodes among the central DC electrode, the RF electrode and the side electrode have round corners facing each other.

15 Claims, 18 Drawing Sheets

(51) Int. Cl.

| | |
|---|---|
| ***H01L 27/18*** | (2006.01) |
| ***H01J 3/00*** | (2006.01) |
| ***H01J 49/00*** | (2006.01) |
| ***H01J 49/42*** | (2006.01) |

(58) Field of Classification Search

USPC ....... 250/292, 281, 283, 282, 288, 291, 286, 250/287, 289, 290, 293, 396 R, 489; 257/E21.09, E21.158, E29.005, E29.068, 257/25; 438/478, 56, 652

See application file for complete search history.

(56) References Cited

U.S. PATENT DOCUMENTS

| | | | | | |
|---|---|---|---|---|---|
| 7,154,088 | B1 * | 12/2006 | Blain | H01J 49/0018 | 250/292 |
| 7,928,375 | B1 * | 4/2011 | Mangan | H01J 49/0018 | 250/283 |
| 8,426,809 | B2 * | 4/2013 | Kumph | H01J 49/0018 | 250/281 |
| 9,177,814 | B2 * | 11/2015 | Chang | G06N 99/002 | |
| 2009/0321719 | A1 * | 12/2009 | Folman | B82Y 10/00 | 257/25 |
| 2016/0027604 | A1 * | 1/2016 | Cho | H01J 49/0013 | 250/489 |

OTHER PUBLICATIONS

International Search Report mailed Oct. 23, 2014 for PCT/KR2014/007364, citing the above reference(s).

* cited by examiner

ION TRAP APPARATUS AND METHOD FOR MANUFACTURING SAME

CROSS-REFERENCE TO RELATED APPLICATIONS

The present application is a continuation of International Patent Application No. PCT/KR2014/007364, filed Aug. 8, 2014, which claims priority to Korean Patent Application No. 10-2013-0121955, filed on Oct. 14, 2013, all of which are hereby incorporated by reference in their entirely.

TECHNICAL FIELD

The present disclosure in one or more embodiments relates to an ion trap device and a method of fabricating the same.

BACKGROUND

The statements in this section merely provide background information related to the present disclosure and does not necessarily constitute prior art.

Quantum key distribution (QKD) systems have design considerations, the most notable of which is the maximum single travel distance of a single photon because of its attenuation while passing through an optical fiber. To increase the maximum single travel distance, signals are amplified using a quantum repeater. Ion trap is a method for implementing a quantum memory for the quantum repeater.

FIGS. 1A to 1C are diagrams illustrating the principle of a three-dimensional trap.

Ion traps are available in a number of shapes depending on the arrangement of the electrodes, including a basic form that can be implemented with a shape of field generated by four electrodes e1, e2, e3 and e4, as shown in FIGS. 1A-1C. When the electrodes e1 and e4 are grounded and a high voltage RF signal is applied to the electrodes e2 and e3 as shown in FIG. 1A, an electric field (E) is formed as shown in FIG. 1B, and the direction of the electric field (E) is continuously changed in response to the radio frequency (RF) of the applied signal. In this case, electrically charged particles are forced, on average, towards the center of the quadrangle (e.g., a square) defined by the electrodes e1, e2, e3 and e4 in FIG. 1B, when the charge amount of the electrically charged particles, mass of the electrically charged particles, strength of the electric field and the radio frequency satisfy certain mathematical conditions. The potential generated by such average force is referred to as a ponderomotive potential.

FIG. 1C is a diagram showing the shape of a ponderomotive potential cDpp formed by the electrodes e1, e2, e3 and e4. Here, the ponderomotive potential is irrelevant to the sign of a charged particle trapped by the electrodes e1, e2, e3 and e4. The potential continues to centrally attract the charged particle despite its tendency to depart from the z-axis (FIG. 1A), but the potential does not contribute to determining the location where the charged particle may be captured along the z-axis. Therefore, in order to trap the electrically charged particle at the location as in FIG. 1A, voltage is applied to satisfy the condition of V1>V2 instead of grounding the electrodes e1 and e4.

FIG. 2A is a diagram illustrating the principle of a two-dimensional trap, and FIG. 2B is a diagram illustrating the direction of a generated electric field and the ponderomotive potential caused by the generated electric field.

High precision fabrication of an ion trap device having a three-dimensional structure as shown in FIGS. 1A-1C is difficult to achieve and integration of multiple traps is also difficult to achieve in some situations. Therefore, for the sake of application to quantum information, the design of the ion trap is modified through a micro electro mechanical system (MEMS) process so as to allow fabrication of the ion trap device on a two-dimensional wafer surface. FIG. 2A illustrates a method of performing a conformal mapping of two-dimensional electrodes to a one-dimensional domain. By applying an RF voltage to thick painted sections of the circumference of a conductive circle and grounding the remainder of the conductive circle as in FIG. 2A, an electric field similar to one illustrated in FIG. 1B is formed within the circle. As illustrated in FIG. 2A, the tangents of RF electrodes defined above are extended to form sections intersecting with an underline. Then, the RF voltage is applied to the intersecting sections and the remainder is grounded, whereby an electric field similar to the one formed within the circle is established at the location where the center of the circle is positioned. FIG. 2B illustrates the direction of the electric field generated when the electrodes are one-dimensionally arranged and the ponderomotive potential caused by the generated electric field. This is achieved by applying the RF voltage to the two thick painted bar type electrodes and grounding the center section between the electrodes and opposite sections outside the RF electrodes.

With an electrode structure produced using the principle described above, electrically charged particles may be captured at the triangle mark in FIG. 2B.

A method of fabricating an ion trap device uses an MEMS-based planar ion trap chip.

An MEMS-based planar ion trap chip traps ions by using an electric field formed by a high voltage RF and a DC (direct current) voltage under Ultra High Vacuum (UHV) while applying a high potential in the range of hundreds of volts to RF electrodes. If the applied voltage is not a high level, the voltage may be applied without problem. However, breakdown is more likely to occur between the RF electrodes and the peripheral electrodes under UHV. For example, the RF electrodes and the DC electrodes are damaged when breakdown occurs between the RF electrodes and the DC electrodes, causing the ion trap chip unusable. A solution for addressing a potential breakdown includes increasing the spacing between the RF electrodes and the DC electrodes, which, however, potentially causes performance degradation of the ion trap chip.

SUMMARY

In accordance with some embodiments of the present disclosure, an ion trap device includes a substrate over which at least one central DC electrode, an RF electrode and at least one side electrode are disposed. The central DC electrode includes a DC connector pad and a DC rail connected to the DC connector pad. The RF electrode includes at least one RF rail located adjacent to the DC rail and an RF pad connected to the at least one RF rail. The RF electrode is disposed between the central DC electrode and the side electrode. At least one pair of electrodes among the central DC electrode, the RF electrode and the side electrode have round corners facing each other.

In accordance with some embodiments of the present disclosure, a method of fabricating an ion trap device includes depositing an insulator over a substrate, depositing a conductive film over the insulator, and patterning the deposited conductive film to form electrode patterns including an RF electrode, a central DC electrode and a side electrode. The patterning of the electrode patterns involves use of a mask having a shape corresponding to the RF electrode, the central DC electrode and the side electrode. The mask has round corners such that each of the RF electrode, the central DC electrode and the side electrode has a round corner corresponding to one of the round corners of the mask.

DETAILED DESCRIPTION

Figure 1A:
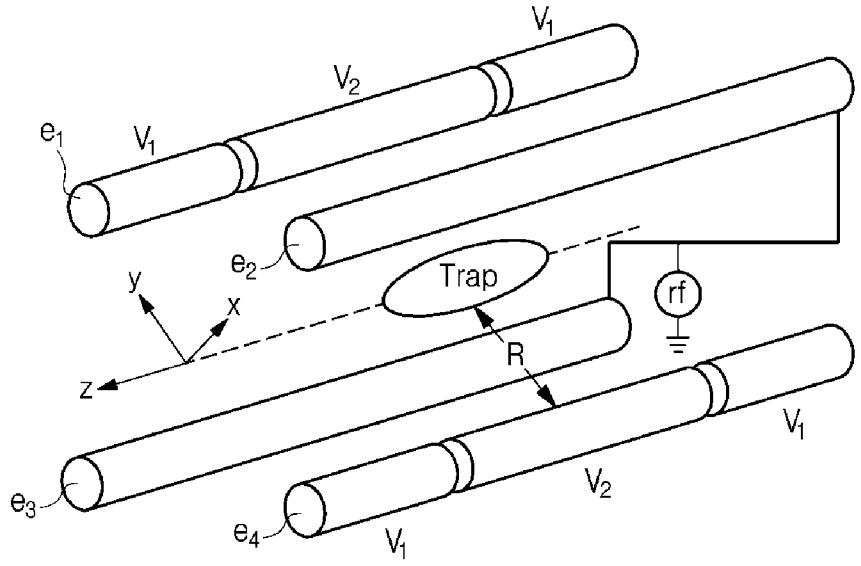
FIGS. 1A-1C are diagrams illustrating the principle of a three-dimensional trap.
Figure 1B:
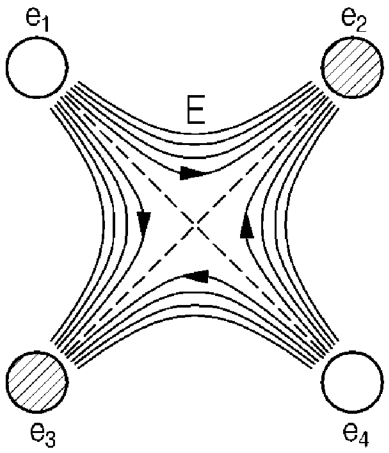
Figure 1C:
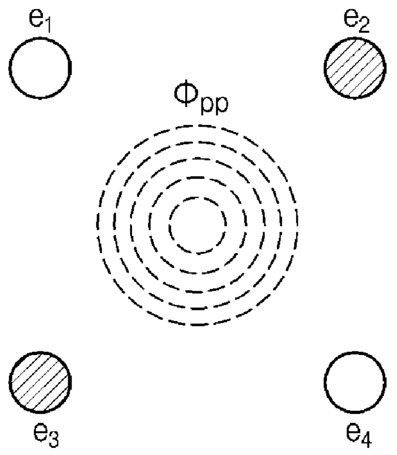
Figure 2A:
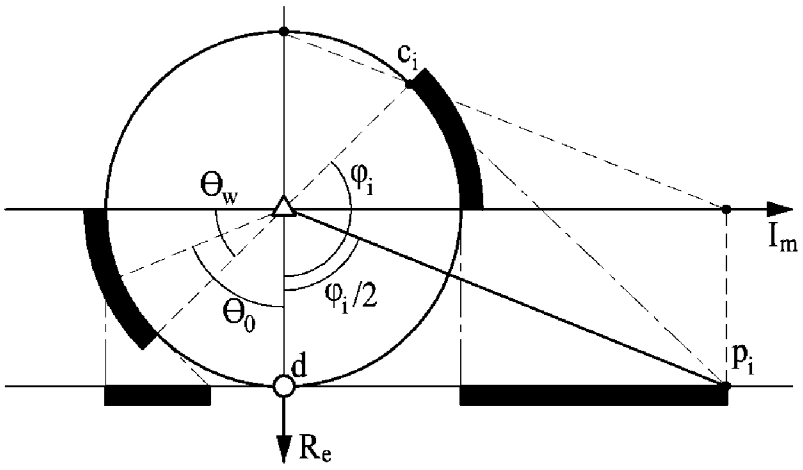
FIG. 2A is a diagram illustrating the principle of a two-dimensional trap.
Figure 2B:
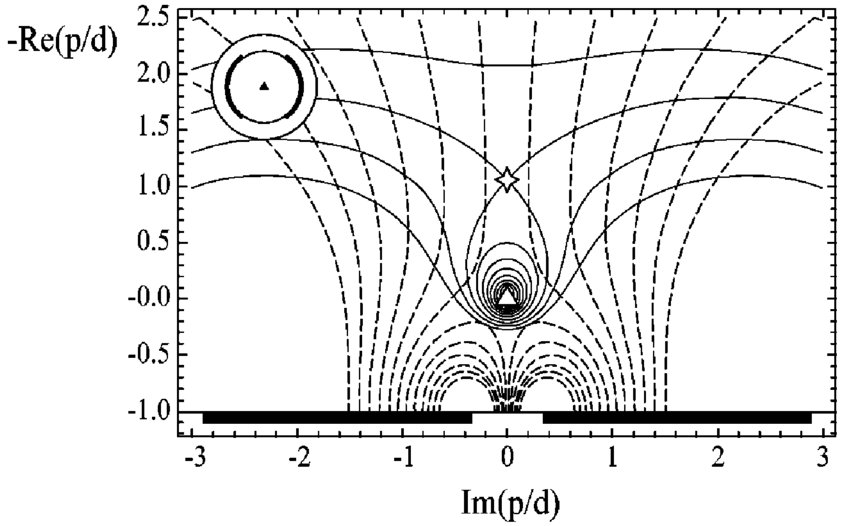
FIG. 2B is a diagram illustrating the direction of a generated electric field and the ponderomotive potential caused by the generated electric field.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, when a first element is described as being "connected" or "coupled" to a second element, such description includes embodiments in which the first and second elements are directly connected or coupled to each other, and also includes embodiments in which the first and second elements are indirectly connected or coupled to each other with one or more other intervening elements in between.

Hereinafter, at least one embodiment of the present disclosure will be described in detail with reference to the accompanying drawings.

Figure 3:
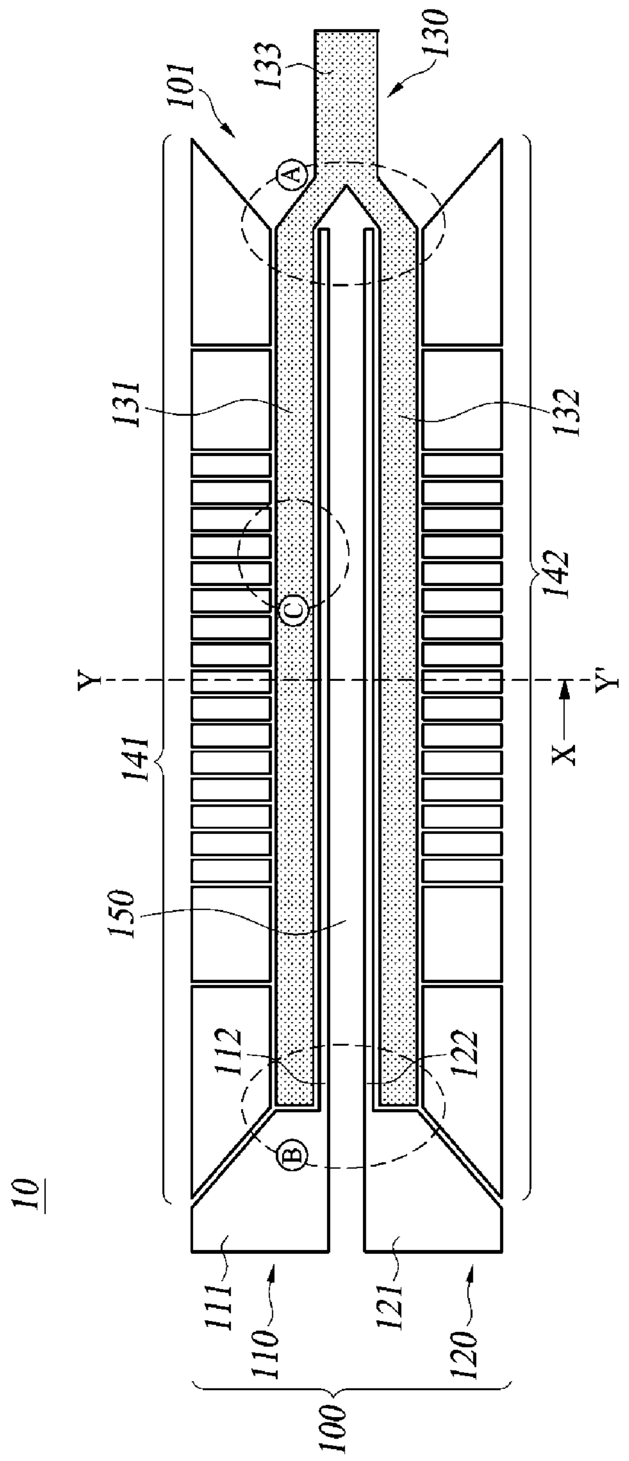
FIG. 3 is a schematic top view showing an ion trap device according to at least one embodiment of the present disclosure.

FIG. 3 is a schematic top view illustrating an ion trap device 10 according to at least one embodiment of the present disclosure.

As illustrated in FIG. 3, the ion trap device 10 includes a semiconductor substrate 101, at least one central DC electrode 100 formed on the semiconductor substrate 101, an RF electrode 130, and at least one side DC electrode 141-142.

In at least one embodiment, at least one central DC electrode 100 includes a first central DC electrode 110 and a second central DC electrode 120.

In at least one embodiment, the semiconductor substrate 101 is made of a silicon substrate. The central DC electrode 100, the RF electrode 130 and the side DC electrode 141-142, are conductive films formed on the silicon substrate, and are made of, but not limited to, metals such as tungsten, aluminum and copper.

The first central DC electrode 110 includes a first DC connector pad 111 formed on the semiconductor substrate 101, and a first DC rail 112 connected to the first DC connector pad 111.

The second central DC electrode 120 includes a second DC connector pad 121 formed on the semiconductor substrate 101, and a second DC rail 122 connected to the second DC connector pad 121.

The first DC rail 112 and the second DC rail 122 have an elongated shape. The first DC rail 112 and the second DC rail 122 are spaced apart from each other by a predetermined gap to define a space serving as a trap region 150. Charged particles which are trapped in the trap region 150 include ions in some embodiments, but the present disclosure is not limited thereto and ion traps in accordance with some embodiments are configured to trap any charged particles.

The RF electrode 130 includes at least one RF rail and an RF pad 133 which are formed on the semiconductor substrate 101. For example, the at least one RF rail includes a first RF rail 131 and a second RF rail 132, which are connected to the RF pad 133.

The first RF rail 131 and the second RF rail 132 each have an elongated shape and have a larger width than that of the first DC rail 112 and the second DC rail 122.

At least one side DC electrode 141-142 includes a plurality of first side electrodes 141, and a plurality of second side electrodes 142. The first RF rail 131 is arranged between the trap region 150 and the first side electrodes 141. The second RF rail 132 is arranged between the trap region 150 and the second side electrodes 142.

The plurality of side DC electrodes 141 and 142 are arranged at predetermined intervals in a longitudinal direction of the RF electrode 130. For example, the plurality of first side electrodes 141 are arranged at predetermined intervals in a longitudinal direction of the first DC rail 112, and the plurality of second side electrodes 142 are arranged at predetermined intervals in a longitudinal direction of the second DC rail 122.

Figure 4:
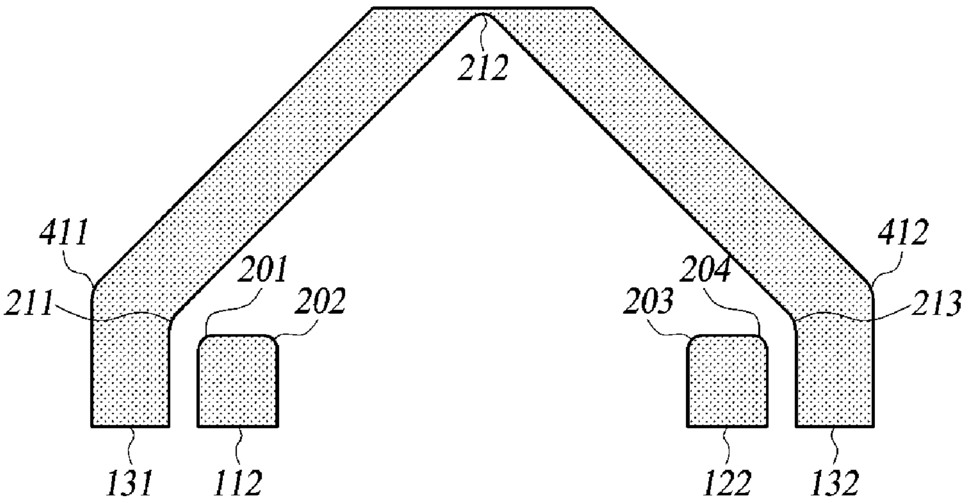
FIG. 4 is an enlarged view of a dotted region designated by "A" of FIG. 3.
Figure 5:
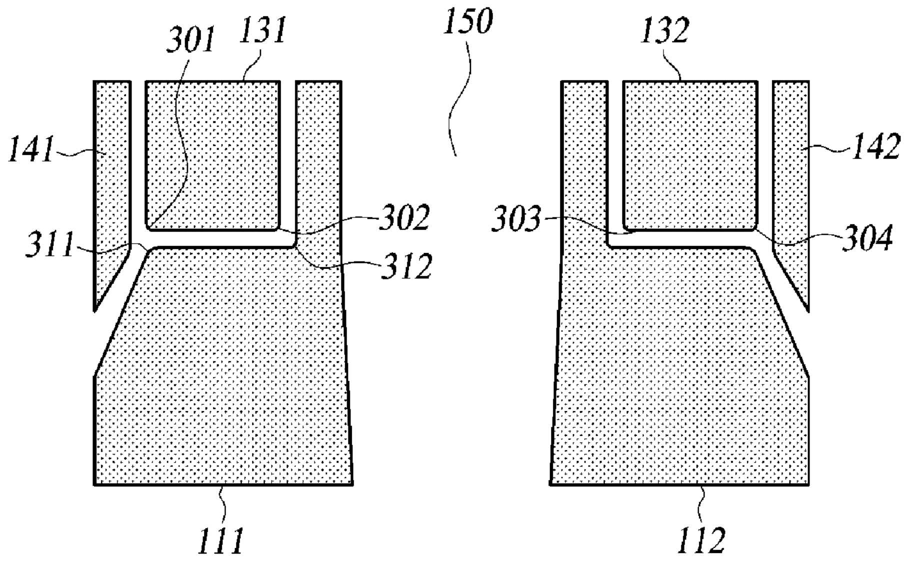
FIG. 5 is an enlarged view of a dotted region designated by "B" of FIG. 3.
Figure 6:
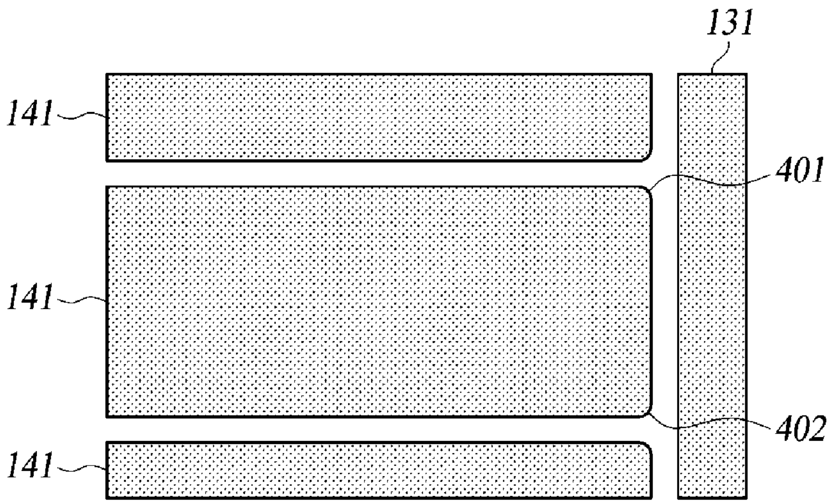
FIG. 6 is an enlarged view of a dotted region designated by "C" of FIG. 3.

FIG. 4 is an enlarged view of a dotted region designated by "A" of FIG. 3. FIG. 5 is an enlarged view of a dotted region designated by "B" of FIG. 3. FIG. 6 is an enlarged view of a dotted region designated by "C" of FIG. 3.

Among the DC, RF and DC side electrodes, at least one pair of electrodes have round corners at portions facing each other.

Referring to FIG. 4, the first DC rail 112 has round corners 201 and 202 formed at an end thereof, and the second DC rail 122 has round corners 203 and 204 formed at an end thereof. Furthermore, inner and outer sides of the RF electrode 130 corresponding to the trap region 150 have round corners 211, 212 and 213 and round corners 411 and 412.

For example, the corner 201 of the first DC rail 112 and the corner 211 of the first RF rail 131 facing the corner 201 have a round shape. Similarly, the corner 204 of the second DC rail 122 and the corner 213 of the second RF rail 132 facing the corner 204 have a round shape. Furthermore, the corner 411 of the first RF rail 131 facing the first side DC electrode 141 and the corner 412 of the second RF rail 132 facing the second DC electrodes 142 respectively have a round shape.

Referring to FIG. 5, the first RF rail 131 has round corners 301 and 302 formed at an end thereof facing another electrode pattern, and the second RF Rail 132 has round corners 303 and 304 formed at an end thereof facing another electrode pattern. Furthermore, each of the first and second DC electrodes 110 and 120 has round corners 311 and 312 at portions disposed close to the first and second RF rails 131 and 132 while facing corresponding ones of the corners 301, 302, 303 and 304.

Referring to FIG. 6, the plurality of first side electrodes 141 and the plurality of second side electrodes 142 have round corners 401 and 402 formed at their ends facing the first RF rail 131 and oriented toward the trap region 150. Although FIG. 6 illustrates only the first side electrodes 141, the second side electrodes 142 also have the same round corners as those of the first side electrodes 141.

In some embodiments, among the DC, RF and DC side electrodes, at least one pair of electrodes has round corners not only at facing portions but also at all of the corners.

Figure 7:
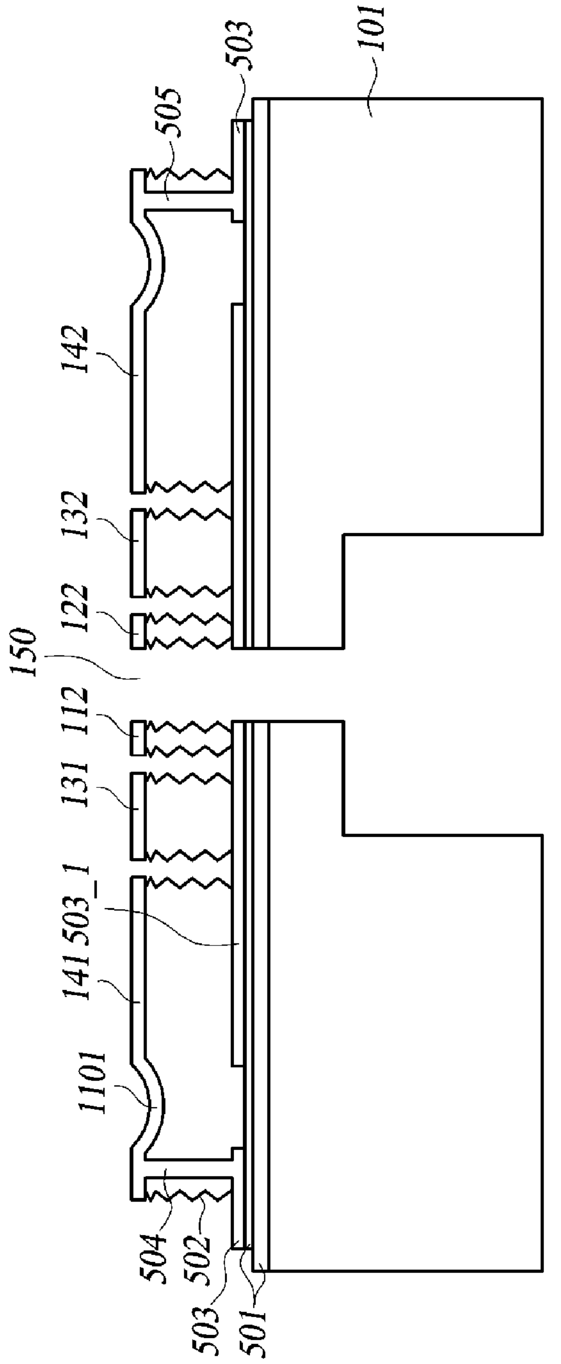
FIG. 7 is a cross-sectional view taken along line Y-Y' of FIG. 3 as viewed in a direction of X.

FIG. 7 is a cross-sectional view taken along line Y-Y' of FIG. 3 as viewed in a direction X.

As illustrated in FIG. 7, the semiconductor substrate 101 and the electrode patterns 112, 122, 131, 132, 141 and 142 are electrically isolated from one another by a first insulator 501 and a second insulator 502 invisible in FIG. 3.

Figure 15:
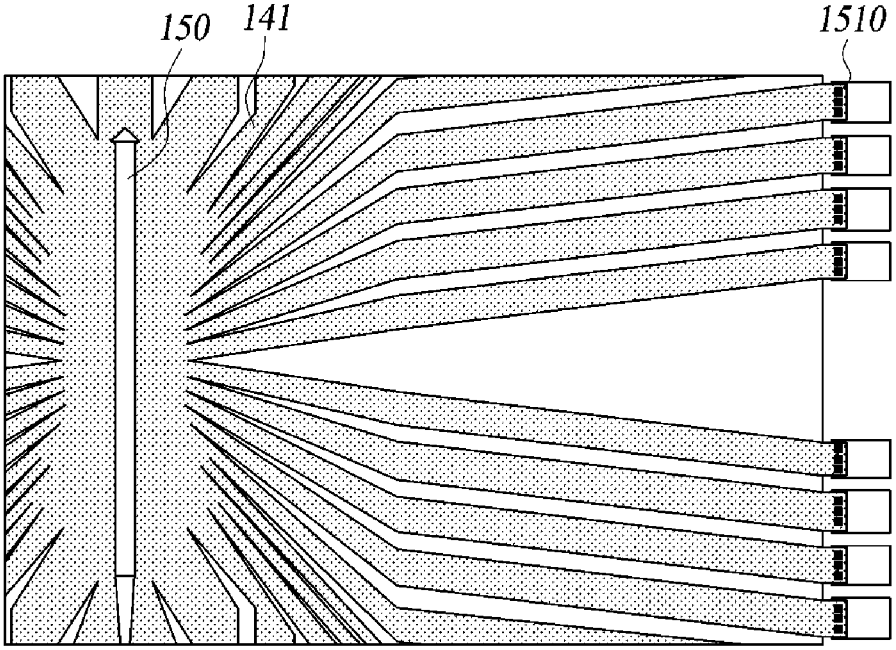
FIG. 15 is a schematic top view showing a connecting structure between side electrodes and bonding pads in accordance with some embodiments.

Disposed between the first insulator 501 and the second insulator is a conductive film 503. The conductive film 503 has first portions connected to bonding pads for connection to the side electrodes provided at the ion trap device 10 and, as such, is connected to the first side electrodes 141 and the second side electrodes 142 through via holes 504 and 505. The conductive film 503 further has a second, remaining portion 503_1 connected to the ground (GND). FIG. 15 is a schematic top view that illustrates a connecting structure between each first side electrode 141 and a bonding pad 1510, in accordance with some embodiments. Although not shown in FIG. 15, another bonding pad to be connected to each second side electrode 142 is also provided in one or more embodiments. For illustration simplicity, spacings between adjacent electrodes in the vicinity of the trap region 150 are not shown in FIG. 15.

In the ion trap device as shown in FIGS. 3 to 7, a desired number of ions is trapped by applying a DC voltage to the first central DC electrode 110 and the second DC electrode 120, applying an RF high voltage to the RF electrode 130, and applying an appropriate electric voltage to a plurality of first side electrodes 141 and second side electrodes 142 corresponding in number to ions to be trapped under the condition that the conductive film 503 is connected to ground (GND). Furthermore, a likelihood of occurrence of breakdown between the electrodes is reduced or minimized even though high voltage RF is applied to the RF electrode 130, since the electrode patterns have round corners.

In addition, trap of ions (or other charged particles) is facilitated since the entire thickness of the semiconductor substrate 101 corresponding to the trap region 150 is removed as illustrated in FIG. 7.

Figure 8:
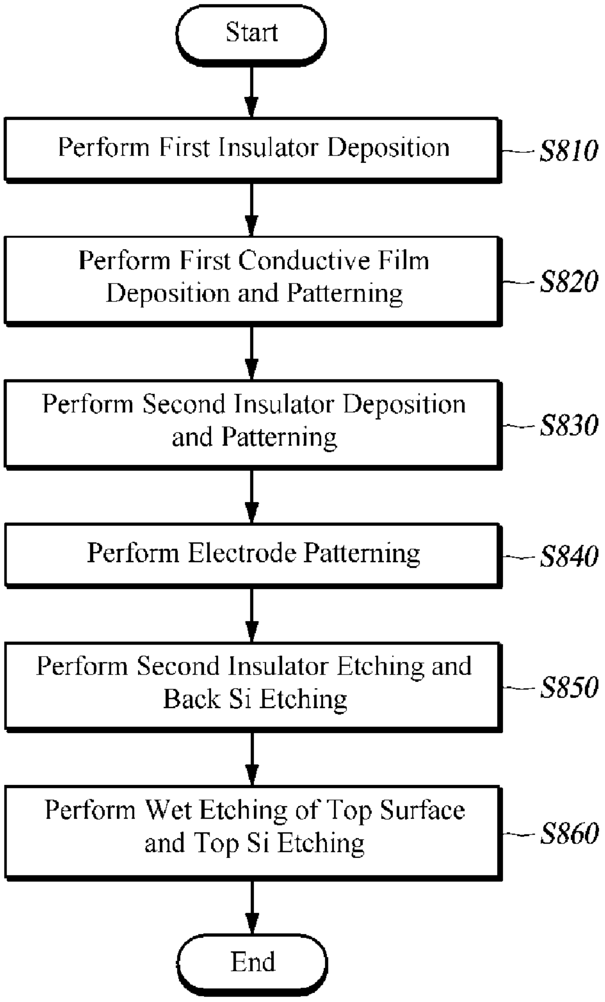
FIG. 8 is a flowchart illustrating a method for fabricating an ion trap chip according to at least one embodiment of the present disclosure.

FIG. 8 is a flowchart illustrating a method for fabricating an ion trap chip, according to at least one embodiment of the present disclosure.

As illustrated in FIG. 8, the method for fabricating an ion trap chip according to at least one embodiment of the present disclosure includes the steps of a first insulator deposition S810, first conductive film deposition and patterning S820, second insulator deposition and patterning S830, electrode patterning S840, second insulator etching and back Si etching S850, and top surface wet etching and top Si etching S860.

Figure 9:
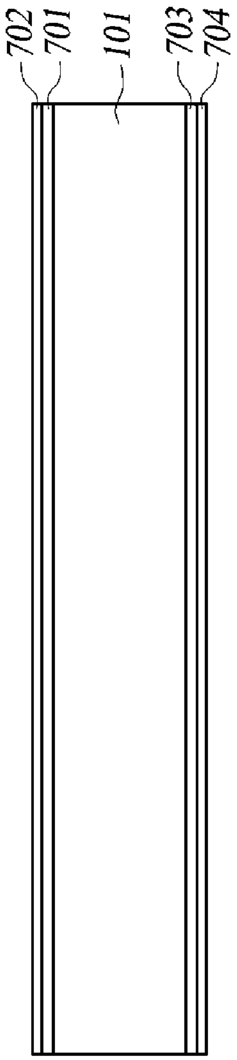
FIGS. 9-14 are cross-sectional views showing an ion trap chip at various fabricating stages according to at least one embodiment of the present disclosure.
Figure 10:
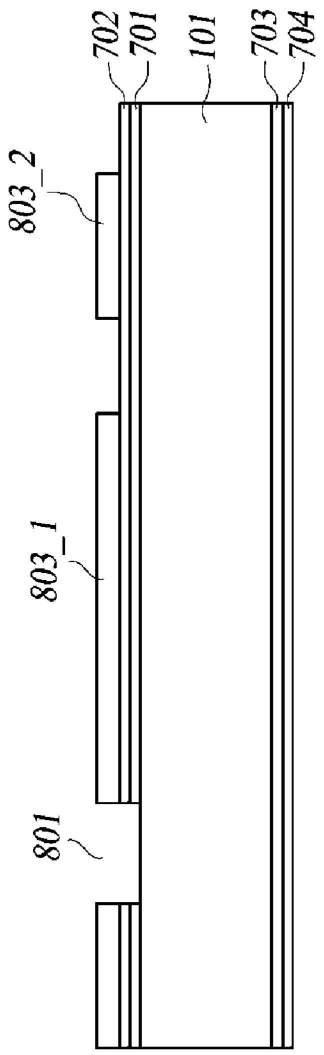
Figure 11:
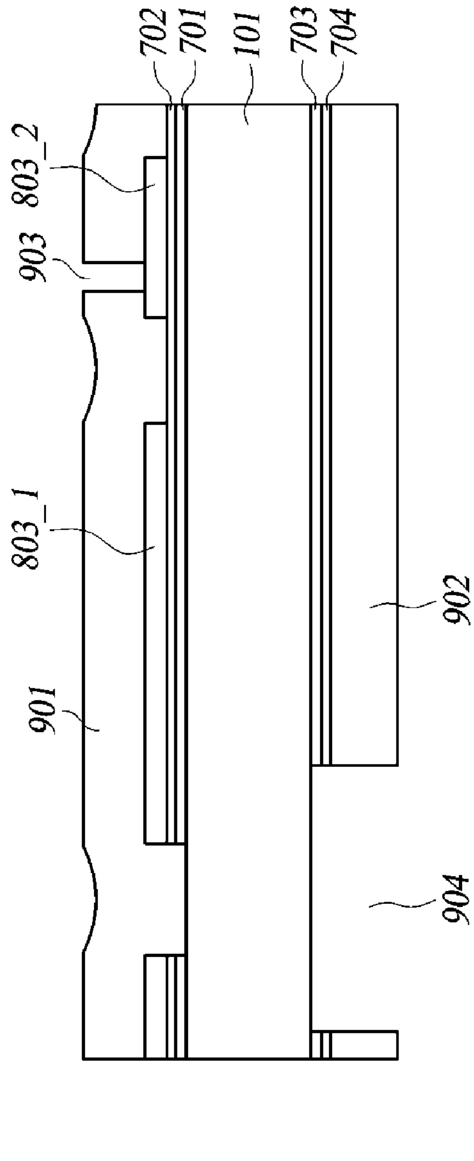
Figure 12:
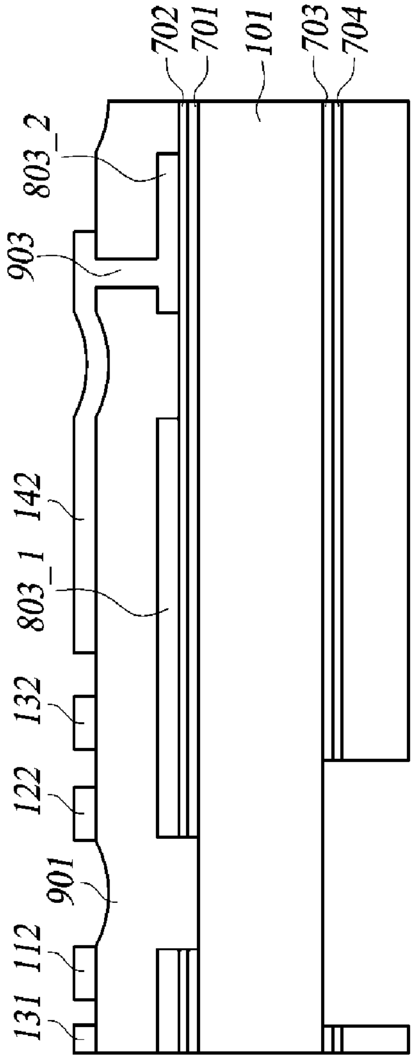
Figure 13:
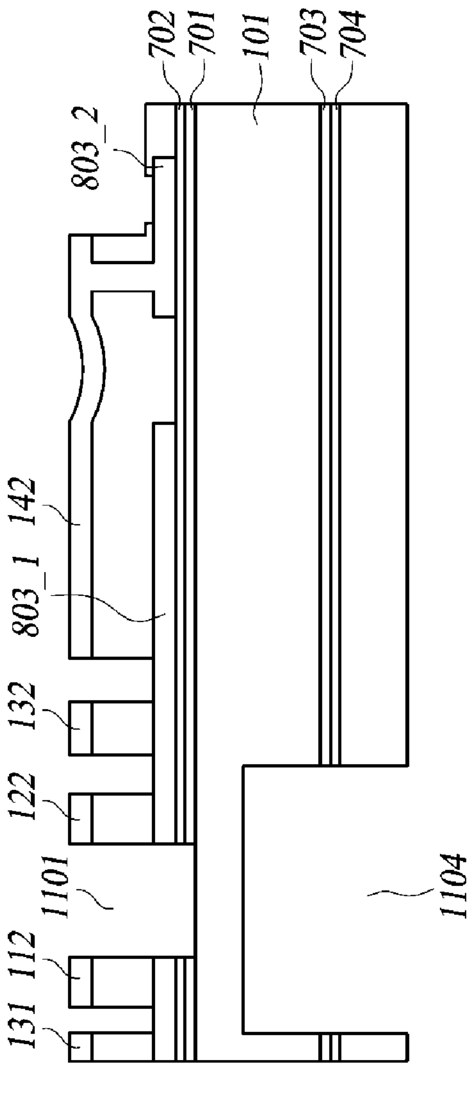
Figure 14:
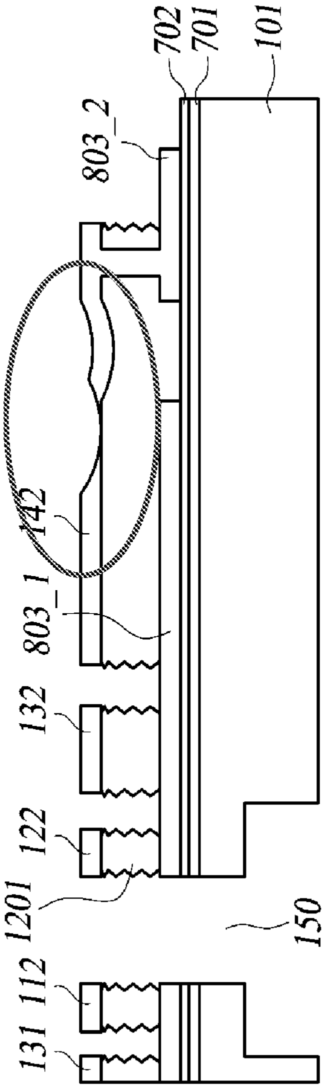

FIG. 9 is a cross-section view of the ion trap chip after the first insulator deposition S810. FIG. 10 is a cross-section view of the ion trap chip after the first conductive film deposition and patterning S820. FIG. 11 is a cross-section view of the ion trap chip after the second insulator deposition and patterning S830. FIG. 12 is a cross-section view of the ion trap chip after the electrode patterning S840. FIG. 13 is a cross-section view of the ion trap chip after the second insulator etching and back Si etching S850. FIG. 14 is a cross-section view of the ion trap chip after the top surface wet etching and top Si etching S860.

As illustrated in FIG. 9, first insulators (corresponding to first insulators 501 in FIG. 7) are deposited on top and bottom surfaces of a semiconductor substrate 101, respectively, in Step S810. In at least one embodiment, silicon dioxide ($SiO_2$) is used as the first insulators. After silicon dioxide layers 701 and 703 as the first insulators are deposited on the semiconductor substrate 101, nitride layers such as silicon nitride layers ($Si_3N_4$) 702 and 704 is further deposited on the silicon dioxide layers 701 and 703, respectively. However, the first insulators are not limited to silicon dioxide and various materials are used as the first insulators in accordance with some embodiments. Chemical Vapor Deposition (CVD) is used as the deposition process in at least one embodiment, although the present disclosure is not limited thereto.

As illustrated in FIG. 10, in operation S820, a first conductive film (corresponding to the conductive film 503 in FIG. 7) is deposited over the top surface of the resultant structure, and then patterning is performed at a region 801 corresponding to a trap region of the ion trap device to be fabricated so as to remove portions of the first conductive film and the first insulators 701 and 702 corresponding to the region 801. In accordance with the patterning, the first conductive film is subsequently removed between a portion 803_2 of the first conductive film to be connected to a bonding pad and a portion 803_1 of the first conductive film. In at least one embodiment, dry etching using plasma is used in the procedure of removing the portions of the first conductive film and first insulators 701 and 702 positioned at the region 801 corresponding to the trap region. Other removal techniques are within the scope of various embodiments.

In some embodiments, the first conductive film is made of metals such as tungsten, aluminum and copper, although the present disclosure is not limited thereto.

As illustrated in FIG. 11, in operation S830, second insulators 901 and 902 are deposited on top and bottom surfaces of the semiconductor substrate 101, respectively, and then the second insulator 901 is patterned to remove a portion corresponding to a via hole 903 for connection of the portion 803_2 of the first conductive film to the bonding pad. On the other side, regions of the second insulator 902 and the first insulators 703 and 704, which correspond to the trap region, are patterned and removed so as to form a region 904 serving as the trap region.

In at least one embodiment, CVD is used as the method for depositing the second insulators 901 and 902, although the present disclosure is not limited thereto. In at least one embodiment, plasma dry etching is used in the procedure of removing the second insulator 902 and the first insulators 703 and 704, although the present disclosure is not limited thereto.

As illustrated in FIG. 12, a second conductive film is deposited on the top surface of the semiconductor substrate 101 to form electrode patterns 131, 112, 122, 132, 142 including the RF electrode 130, central DC electrode 100 and side DC electrode 140 in operation S840.

FIG. 12 shows only first and second RF rails 131 and 132 as a part of the RF electrode 130, only first and second DC rails 112 and 122 as a part of the central DC electrode 100 and only a second side electrode 142 as a part of the side DC electrode 140. The second side electrode 142 and the first conductive film 501 are electrically connected to each other through the second conductive film deposited in the via hole 903.

Formation of the electrode patterns on the top surface of the semiconductor substrate 101 involves use of a certain mask. In at least one embodiment, the mask is configured in such a way as to mask the remaining regions excluding the shaded regions of FIGS. 4 to 6 thus forming the electrode patterns in the shaded regions. As described with respect to FIGS. 4 to 6, round corners added to the facing sides/portions of the electrode patterns minimize the breakdown which potentially occurs when high voltage RF is applied.

In at least one embodiment, CVD is used as a process of forming the electrode patterns, although the present disclosure is not limited thereto. Furthermore, in at least one embodiment, the second conductive film is made of metals such as tungsten, aluminum and copper, although the present disclosure is not limited thereto.

As illustrated in FIG. 13, in operation S850, the second insulator 901 is removed outside the regions where the second conductive film (e.g., electrode patterns 131, 112, 122, 132, 142) is deposited. In at least one embodiment, plasma is used in removal of the second insulator 901, although the present disclosure is not limited thereto.

Subsequently, the bottom surface of the semiconductor substrate 101 is etched at the region corresponding to the trap region so as to partially remove the semiconductor substrate 101 to a predetermined depth. In at least one embodiment, etching using plasma is used in the etching procedure, although the present disclosure is not limited thereto and various etching technologies are adopted in various embodiments.

As illustrated in FIG. 14, in operation S860, the top surface of the resulting structure is wet etched. As a result, the second insulator 901 is partially removed at exposed surfaces adjacent to the electrode patterns such that a width of the second insulator 1201 disposed under each of the electrode patterns is smaller than the width of the electrode pattern. The wet etching involves use of liquid chemicals having strong acidity or strong basicity, and various chemicals are used in accordance with various embodiments. If electric charges are present in the second insulator 1201, the second insulator 1201 potentially has an effect on ability to trap electric charges injected into the trap region 150. In some embodiments, the configuration with a narrower width of the second insulator 1201 disposed under each of the electrode patterns than that of the electrode pattern minimizes the effect caused by the second insulator 1201.

Thereafter, the top surface of the semiconductor substrate 101 is etched off at the trap region so as to remove the portion of the semiconductor substrate 101 corresponding to the trap region 150. In at least one embodiment, dry etching using plasma is used in etching of the semiconductor substrate 101, although the present disclosure is not limited thereto. The second insulator 902 and layers 703, 704 on the bottom surface of the semiconductor substrate 101 are removed as well.

As described above, some embodiments in the present disclosure are highly useful because capability and reliability in trapping of charged particles, such as ions, are improved by designing the shapes of electrodes for improvement of electrical properties of the electrodes.

Some embodiments provide a solution to minimize potential breakdown, without affecting the performance of the ion trap chip. One or more embodiments are particularly useful in minimizing potential breakdown especuially in situations when the number of electrodes is increased in order to accurately and variously control ions within the limited dimensions of the ion trap chip, or when the spacing between the electrodes is reduced for miniaturization of the ion trap chip.

Exemplary embodiments of the present disclosure have been described for illustrative purposes, although those skilled in the art will appreciate that various modifications, additions and substitutions are possible, without departing from the various characteristics of the disclosure. Therefore, exemplary embodiments of the present disclosure have been described for the sake of brevity and clarity. Accordingly, one of ordinary skill would understand that the scope of the disclosure is not limited by the explicitly described above embodiments.

The invention claimed is:

1. An ion trap device, comprising:
a substrate;
at least one central DC electrode disposed over the substrate and comprising:
a DC connector pad, and
a DC rail connected to the DC connector pad;
an RF electrode disposed over the substrate and comprising:
at least one RF rail located adjacent to the DC rail, and
an RF pad connected to the at least one RF rail; and
at least one side electrode disposed over the substrate, wherein
the RF electrode is disposed between the central DC electrode and the side electrode, and
at least one pair of electrodes among the central DC electrode, the RF electrode and the side electrode have round corners facing each other.

2. The ion trap device of claim 1, wherein
the central DC electrode comprises a first central DC electrode having a first DC rail and a second central DC electrode having a second DC rail,
the first DC rail and the second DC rail are spaced apart from each other to form a trap region therebetween, and
an entire thickness of the substrate is removed at a region corresponding to the trap region.

3. The ion trap device of claim 2, wherein the RF electrode has a round corner at an inner side facing the trap region.

4. The ion trap device of claim 1, wherein the at least one side electrode includes a plurality of side electrodes disposed at predetermined intervals in a longitudinal direction of the RF electrode.

5. The ion trap device of claim 1, further comprising:

an insulator disposed between (i) the at least one central DC electrode, the RF electrode and the at least one side electrode and (ii) the substrate, wherein each of the at least one central DC electrode, the RF electrode and the at least one side electrode has a larger width than that of the insulator disposed thereunder.

6. The ion trap device of claim 1, further comprising:

an insulator disposed between (i) the at least one central DC electrode, the RF electrode and the at least one side electrode and (ii) the substrate, a conductive film between the insulator and the substrate, wherein the conductive film comprises a first portion connecting the side electrode to a corresponding bonding part, and a second portion separated from the first portion and connected to the ground.

7. The ion trap device of claim 1, wherein all corners of at least one of the RF electrode, the central DC electrode and the side electrode are round corners.

8. The ion trap device of claim 1, wherein the substrate is a semiconductor substrate.

9. A method of fabricating an ion trap device, the method comprising:

depositing an insulator over a substrate;

depositing a conductive film over the insulator; and forming electrode patterns including an RF electrode, a central DC electrode and a side electrode; and wherein the forming of the electrode patterns includes:

masking the electrode patterns on the deposited conductive film; and etching remnants of the deposited conductive film left from the masking, and wherein each of the RF electrode, the central DC electrode and the side electrode has a shape of round corners.

10. The method of claim 9, wherein at least one pair of electrodes among the central DC electrode, the RF electrode and the side electrode have the respective round corners facing each other.

11. The method of claim 9, further comprising:

removing an entire thickness of the substrate at a region corresponding to a trap region, wherein the central DC electrode comprises a first central DC electrode having a first DC rail and a second central DC electrode having a second DC rail, and the first DC rail and the second DC rail are spaced apart from each other by the trap region therebetween.

12. The method of claim 9, further comprising:

reducing a width of the insulator under each of the central DC electrode, the RF electrode and the side electrode to be smaller than a width of the overlying central DC electrode, RF electrode or side electrode.

13. The method of claim 12, wherein said reducing comprises wet etching.

14. The method of claim 9, wherein all corners of at least one of the RF electrode, the central DC electrode and the side electrode are round corners.

15. The method of claim 9, wherein the substrate is a semiconductor substrate.

* * * * *